(12) United States Patent
McCulloch et al.

(10) Patent No.: US 6,569,718 B2
(45) Date of Patent: May 27, 2003

(54) TOP GATE THIN-FILM TRANSISTOR AND METHOD OF PRODUCING THE SAME

(75) Inventors: David J. McCulloch, Red HIll (GB); Carl Glasse, Red Hill (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 66 days.

(21) Appl. No.: 09/754,180

(22) Filed: Jan. 3, 2001

(65) Prior Publication Data

US 2001/0026962 A1 Oct. 4, 2001

(30) Foreign Application Priority Data

Jan. 7, 2000 (GB) .............................................. 0000292

(51) Int. Cl.$^7$ ...................... H01L 21/339; H01L 21/00; H01L 21/84
(52) U.S. Cl. ........................................ 438/149; 257/57
(58) Field of Search ................................ 438/161, 311, 438/149, 158, 315, 334; 257/57, 72, 411

(56) References Cited

U.S. PATENT DOCUMENTS 5,585,292 A * 12/1996 Morita et al. ................ 438/151
5,614,729 A * 3/1997 Ukai et al. .................... 257/57
5,773,844 A * 6/1998 Kawamura et al. ......... 257/411
5,981,317 A * 11/1999 French et al. ................ 438/161

FOREIGN PATENT DOCUMENTS

EP 0691688 A2 1/1996 ......... H01L/29/786

* cited by examiner

*Primary Examiner*—Ngân V. Ngô
*Assistant Examiner*—Thao Xi Le
(74) *Attorney, Agent, or Firm*—Aaron Waxler

(57) ABSTRACT

A method of producing a top gate thin-film transistor in which an insulated gate structure (14) is formed over an amorphous silicon layer with upper gate conductor (16) directly over the gate insulator layers. The gate conductor is patterned to be narrower than a spacing to be provided between source and drain electrode contacts. Laser annealing of areas of the amorphous silicon layer (12) not shielded by the gate conductor (16) is carried out to form polysilicon portions. The gate insulator layers are formed as a gate insulator layer (14a,14b) of first refractive index, and an overlying surface insulator layer (14c) of second, lower, refractive index. The overlying surface insulator layer has been found to reduce fluctuations in the reflectance of the structure in dependence upon the specific thicknesses of the gate insulator layers. Therefore, the tolerances for the thicknesses of the gate insulator layers can be reduced whilst maintaining control of the laser annealing process.

15 Claims, 5 Drawing Sheets

TOP GATE THIN-FILM TRANSISTOR AND METHOD OF PRODUCING THE SAME

FIELD OF THE INVENTION

This invention relates to a top gate (staggered or planar) thin-film transistor and a method for producing the same. More particularly, the invention relates to a method in which a self-aligned gate is produced through the use of a laser annealing process. These thin-film transistors are suitable for use in flat panel display devices, for example active-matrix liquid-crystal displays, or in other large-area electronic devices.

BACKGROUND OF THE INVENTION

Various methods have been proposed for defining self-aligned gate structures in top gate thin-film transistors. In some of these methods, the gate conductor has a width which is smaller than the spacing between the source and drain electrodes. This provides some freedom in the positioning of an insulated gate structure over the silicon body of the transistor. Various processes have been proposed for treating the silicon body of the transistor in those areas between the channel region (beneath the gate) and the source and drain electrodes. This is required to reduce the resistance of the silicon layer in regions other than the channel area of the transistor.

The use of the gate electrode in this process results in a self-aligned structure. One proposed method for reducing this resistance is by doping and laser annealing of the silicon layer on either side of the channel area of the transistor, using the insulated gate structure as a mask to protect the channel area. EP 0691688 discloses a method of manufacturing a top gate thin-film transistor using laser annealing and doping of the silicon layer to reduce the contact resistance to the source and drain electrodes.

The method disclosed in EP 0691688 will be described with reference to FIG. 1.

The transistor is formed on a glass substrate 2. An insulation film 4 overlies the glass substrate to provide a more uniform surface than that of the substrate 2. Metallic source and drain electrodes 6 and 8 are formed over the insulation film 4. These electrodes may be formed of ITO (indium tin oxide), Molybdenum or a Molybdenum alloy. The source and drain electrode 6, 8 are spaced apart, and the silicon body of the transistor fills this spacing, as will be described below.

The entire face of the substrate is treated with a plasma to diffuse dopant atoms 10 into the surface. These dopant atoms are employed to reduce the resistance of the silicon body of the transistor in regions other than the channel area of the transistor.

An amorphous silicon semiconductor layer 12 covers the spacing between the source and drain electrode 6, 8 and also partially overlies those electrodes as shown in FIG. 1. Subsequently, a gate insulation film 14 and a gate conductor layer 16 are provided, and the gate conductor layer 16 is patterned to define the gate electrode as shown in FIG. 1.

Subsequent laser irradiation 18 causes the dopant atoms 10 to diffuse into the semiconductor layer 12. The gate electrode 16 acts as a shield so that this diffusion process is inhibited in the channel area of the transistor. The laser treatment also causes the amorphous silicon 12 to melt, and during subsequent cooling the silicon becomes crystallized to form doped polysilicon source and drain regions 12a, 12b, thereby reducing the resistance between the source and drain electrodes 6, 8 and the channel area 12c of the transistor. It is desirable that there is no high-resistance undoped semiconductor material to which no gate voltage is applied, since this increases the ON-resistance of the transistor. The laser annealing and doping as described in EP 0691688 therefore reduces the ON-resistance, to improve the response characteristics of the transistor. Furthermore, the use of a gate conductor 16 having a width less than the spacing between the source and drain electrode 6, 8 assists in reducing the parasitic capacitances within the transistor structure.

A problem with the method described above is that the laser annealing of the semiconductor layer 12, to form polysilicon source and drain regions 12a, 12b, may be difficult to control for reliable results. In particular, the laser annealing process conditions are selected with a specific expected reflectance during the laser annealing process taken into consideration. This is required because the laser annealing must be controlled such that there is crystallization throughout the full depth of the semiconductor layer, but without over exposure of the structure. Slight variations in the thickness of the gate insulation film 14 dramatically affect the overall reflectance of the structure during the laser annealing process, as a result of the interference of reflected signals from different boundaries.

An alternative approach is to crystallise the amorphous silicon layer immediately after deposition. In this case, the layer is already crystallised before the laser treatment process, and this laser process is purely for activation of the dopant atoms. There is still a desire to optimise the laser treatment process, in particular to reduce the exposure of the gate to the laser energy, which can result in damage to the gate structure.

U.S. Pat. No. 5,773,844 discloses a method of manufacturing a transistor in which laser annealing is used to convert regions of the amorphous silicon body of the transistor into polycrystalline silicon regions. The gate insulator beneath the gate conductor comprises a three-layer structure. Two of the three layers extend across the full width between the source and drain electrodes of the transistor, and laser annealing is carried out through these two layers. A third gate insulator layer is patterned beneath the gate conductor prior to laser annealing, and this third patterned gate insulator layer is substantially thicker than the first two layers, and provides the operating characteristics of the insulated gate transistor.

The two gate insulator layers of U.S. Pat. No. 5,773,844 through which laser annealing is performed are very thin to provide a very low reflectance, and they act as reflectivity reducing films for reducing the reflectivity of the underlying amorphous silicon layer with respect to the laser beam.

This process requires patterning of the thicker gate insulator layer which defines the operating characteristics of the transistor, and therefore introduces an additional etching step, which could otherwise be avoided.

SUMMARY OF THE INVENTION

According to a first aspect of the invention, there is provided a method of producing a top gate thin-film transistor, comprising the steps of: forming an amorphous silicon layer over an insulating substrate; forming an insulated gate structure over the amorphous silicon layer comprising gate insulator layers and an upper gate conductor directly over the gate insulator layers, the gate conductor being patterned to be narrower than a spacing to be provided between source and drain electrode contacts to the silicon layer; laser annealing areas of the amorphous silicon layer not shielded by the gate conductor, through all of the gate insulator layers, to form polycrystalline silicon (polysilicon) portions, wherein the gate insulator layers are formed as a gate insulator layer of first refractive index, and an overlying surface insulator layer of second, lower, refractive index.

In the method of the invention, laser annealing is performed through all of the gate insulator layers, so that no additional etching steps are required.

The overlying surface insulator layer has been found to reduce fluctuations in the reflectance of the structure in dependence upon the specific thicknesses of the gate insulator layers. Therefore, the tolerances for the thicknesses of the gate insulator layers can be reduced whilst maintaining control of the laser annealing process.

The method may be applied to a staggered top gate transistor, in which case a source and drain electrode pattern is provided on the substrate before the formation of the amorphous silicon layer. Preferably, the substrate is subjected to plasma treatment to form a doped surface layer having impurity atoms diffused therein, with the laser annealing forming polysilicon portions having the impurities doped therein.

Alternatively, the method may be applied to a planar top gate transistor, in which case a source and drain electrode pattern is formed over the gate insulator, the source and drain electrodes contacting the silicon layer through wells defined in the gate insulator.

In either case, the gate insulator may comprise first and second gate insulator layers, with the first layer being patterned with the amorphous silicon layer to define the transistor body. The or each gate insulator layer may comprise silicon nitride, and the surface insulator preferably comprises silicon oxide.

According to a second aspect of the invention, there is provided a method of producing a top gate thin-film transistor, comprising the steps of:

forming an amorphous silicon layer over an insulating substrate;

treating the silicon layer to form a polysilicon layer;

forming an insulated gate structure over the amorphous silicon layer comprising gate insulator layers and an upper gate conductor directly over the gate insulator layers, the gate conductor being patterned to be narrower than a spacing to be provided between source and drain electrode contacts to the silicon layer;

implanting a dopant into the regions of the polysilicon layer not shielded by the gate conductor;

laser treating the regions of the polysilicon layer not shielded by the gate conductor to activate the dopant atoms, wherein the gate insulator layers are formed as a gate insulator layer of first refractive index, and an overlying insulator layer of second, lower, refractive index.

In this method, the laser treatment is for activating the dopant atoms, and the silicon layer is already crystallised. The double layer gate insulator enables the reflectivity to be reduced so that the laser treatment process does not damage the transistor components. The thickness of the layers can be optimised for minimum reflectivity and also for minimum sensitivity of the reflectivity to thickness variations, as discussed above. In particular, the laser treatment process comprises exposing the structure to laser light of predetermined wavelength, the thickness of the gate insulator layers being selected depending on the wavelength, to reduce the effect of thickness variations in the gate insulator layers on the reflectance of the structure at the predetermined wavelength.

Preferably the gate insulator layers are formed as a lower gate insulator layer, the gate insulator layer of first refractive index overlying the lower gate insulator and the overlying insulator layer of second, lower, refractive index. This three layer gate insulator provides additional degrees of freedom to enable the optimisation of the reflective properties of the gate insulator.

The lower gate insulator may comprise silicon oxide, the gate insulator layer of first refractive index may comprise silicon nitride and the gate insulator of second, lower, refractive index may comprise silicon oxide. Each silicon oxide layer preferably then has a thickness of 8 to 15 nm and the silicon nitride layer has a thickness of between 15 and 30 nm.

The invention also provides a top gate thin-film transistor comprising:

a silicon layer provided over an insulating substrate;

an insulated gate structure over the silicon layer, comprising a gate insulator and an upper gate conductor, the gate conductor being patterned to be narrower than a spacing between source and drain electrode contacts to the silicon layer, the silicon layer in the region of the source and drain electrodes comprising polycrystalline silicon, wherein the gate insulator comprises a gate insulator layer of first refractive index, and an overlying upper gate insulator layer of second, lower, refractive index, the gate conductor being provided over the upper gate insulator layer, the gate insulator layer and the upper gate insulator layer extending fully across the spacing between contacts of the source and drain to the silicon layer.

The silicon layer beneath the gate conductor may comprises amorphous silicon or polycrystalline silicon.

BRIEF DESCRIPTION OF THE DRAWINGS

Embodiments of the invention will now be described by way of example, with reference to and as shown in the accompanying drawings in which.

Figure 1:
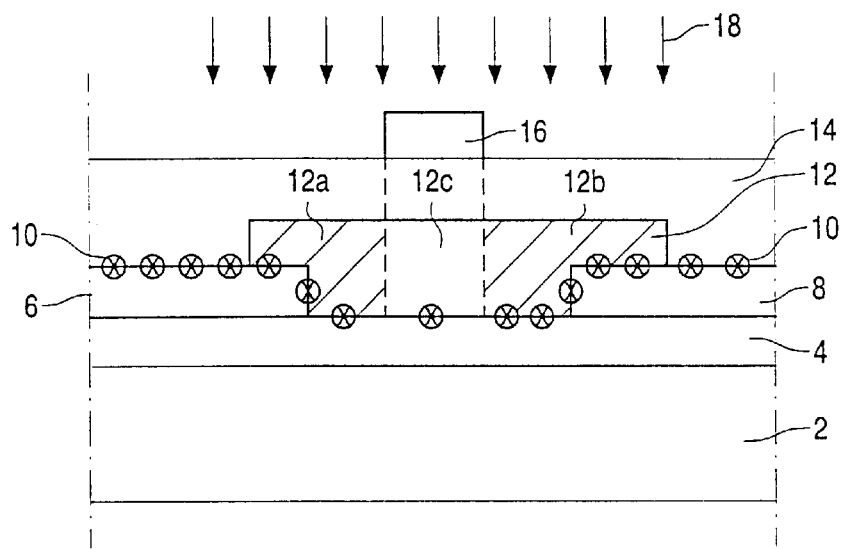
FIG. 1 shows a known thin-film transistor configuration, in which laser annealing is used during the manufacturing process to define polysilicon regions giving a self-aligned gate structure.

The figures are diagrammatic and not drawn to scale. Relative dimensions and proportions of parts of these figures have been shown exaggerated or reduced in size, for the sake of clarity and convenience in the drawings.

DETAILED DESCRIPTION OF THE PRIMARY EMBODIMENT

Figure 2:
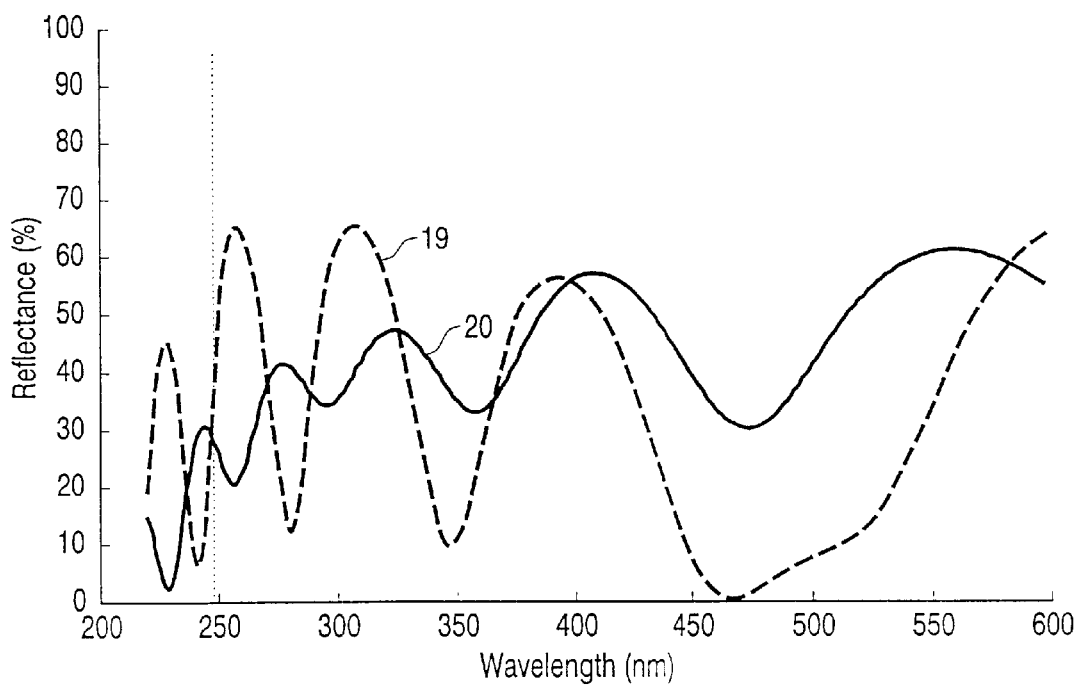
FIG. 2 shows the reflectance of the gate insulator to laser light for the transistor of FIG. 1, and for the transistor of the invention.

FIG. 2 shows, with curve 19, the reflectance of the structure illustrated in FIG. 1, for one specific configuration, and as a function of the wavelength of an incident light signal. A thickness of the insulating layer 14 over the semiconductor Layer 12 is assumed as 330 nm of silicon nitride. The oscillations in curve 19 represent interference effects between layer boundaries of the films of the structure for different wavelengths of signal. Variations in the thickness of the insulating film will shift the curve 19 along the x-axis.

Therefore, for a given wavelength signal, which may be dictated by the need for a practical laser source for the annealing process, variations in the thickness of the insulating layer can dramatically affect the reflectance of the structure. A dotted line is represented at 248 nm, which represents a krypton fluoride excimer laser. As can be seen with reference to FIG. 2, a slight shift of the curve 19 to the left or right can result in the reflectance fluctuating between a maxima and a minima of the reflectance curve. This makes control of the laser annealing process conditions very difficult in order to obtain a desired amount of heating to result in melting of the full thickness of the silicon film without over exposure.

Figure 3:
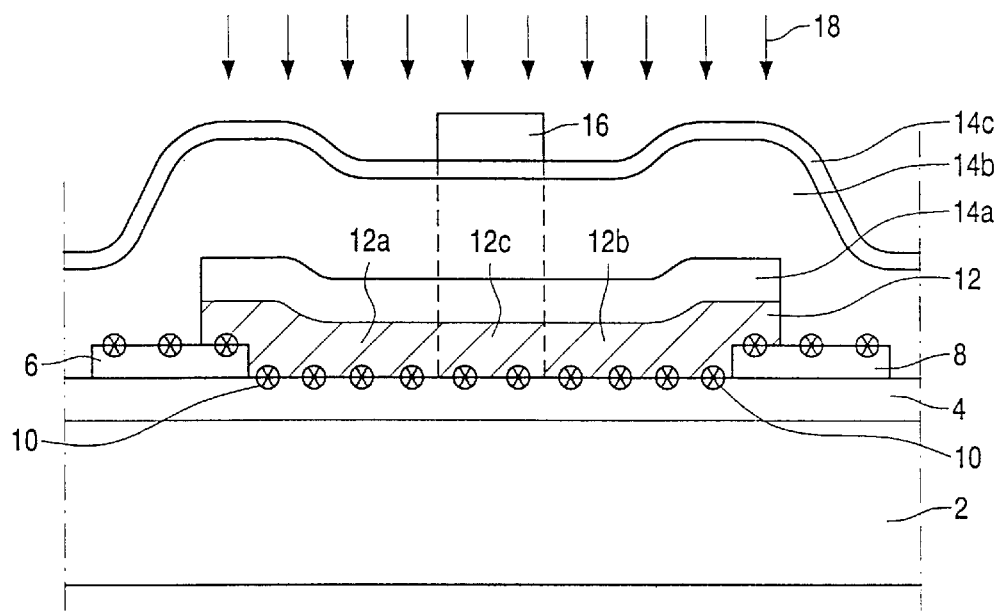
FIG. 3 shows a first embodiment of thin-film transistor of the invention.

The thin-film transistor shown in FIG. 3 comprises an insulating substrate 2 over which an optional insulating film 4 is provided. Source and drain electrodes 6, 8 are defined over the insulating film 4. The surface of the source and drain electrodes 6, 8 and the insulating film 4 is subjected to a plasma treatment to form a doped surface layer having impurity atoms 10 diffused therein. An amorphous silicon layer 12 is formed over the doped surface layer over at least the spacing between the source and drain electrodes 6, 8 and at least partially overlying those regions. The silicon layer 12 defines a channel portion 12c of the transistor which is narrower than the spacing between the source and drain electrodes 6, 8, and comprises substantially undoped amorphous silicon. An insulated gate structure 14, 16 is defined over the channel portion 12c.

On either side of the channel portion 12c, the silicon layer defines source and drain portions 12a, 12b which have been treated to result in doping by the impurity atoms 10 and to result in crystallization to form polysilicon regions.

As shown in FIG. 3, the gate insulator comprises three layers. A first layer 14a is patterned with the amorphous silicon layer 12, whereas the second and third layers 14b, 14c extend over the full area of the transistor. None of the three insulator layers is patterned beneath the gate conductor 16, so that the laser annealing process, represented by arrows 18, is performed through all three insulator layers.

In one example, the first and second insulator layers 14a, 14b each comprise silicon nitride, and they may have a combined thickness of approximately 300 nm. The third insulator layer 14c comprises an overlying surface insulator layer, which is formed from a material having a lower refractive index, for example silicon oxide having a thickness of 40 nm. The effect of the surface layer 14c is to decrease the variability of the reflectance to the laser light 18 used for the annealing process.

Referring to FIG. 2, plot 20 represents the reflectance of the structure shown in FIG. 3 for combined silicon nitride thickness of 300 nm and silicon oxide thickness of 40 nm. The oscillations in the signal are dampened, so that shifting the curve 20 along the x-axis has less effect on the reflectance of the structure. Consequently, the laser annealing conditions may be controlled more accurately to give rise to the desired crystallization of the amorphous silicon layer.

The refractive index and thickness of the surface layer 14c can be selected to give a flattened reflectance curve around the wavelength of the laser source to be used for the annealing process. For example, a krypton fluoride excimer laser has a wavelength of 248 nm, which is shown in FIG. 2, and a xenon fluoride excimer laser has a wavelength of 308 nm.

The method of manufacturing a thin-film transistor as shown in FIG. 3 will be described in greater detail with reference to FIG. 4.

Figure 4A:
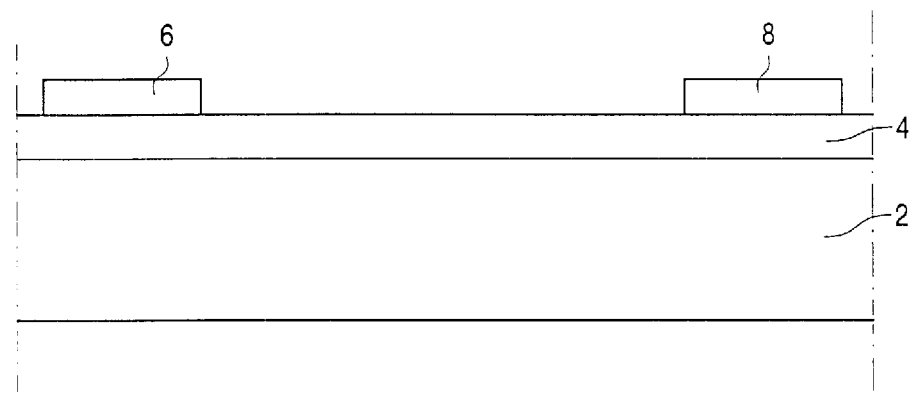
FIG. 4 shows various steps in the manufacture of the thin-film transistor of FIG. 3.

As shown in FIG. 4A, an insulation film 4 such as $SiO_2$ or $SiN_x$ is formed over one side of a glass substrate 2. Source and drain electrodes 6, 8 define a source and drain electrode pattern which may be formed by wet etching of a metallic layer, such as ITO (indium tin oxide), Mo (Molybdenum) or Mo alloy.

Figure 4B:
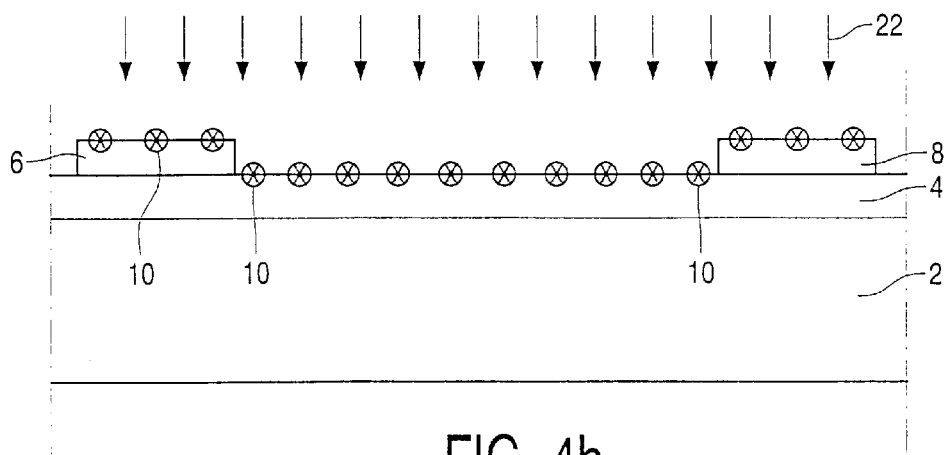

As shown in FIG. 4B the surface of the structure of FIG. 4A is subjected to plasma treatment 22, for example a $PH_3$ plasma, to diffuse P atoms 10 into the surface in order to form a doped surface layer. Subsequently, an amorphous silicon layer 12 is deposited comprising source and drain portions 12a, 12b which contact the source and drain electrodes 6, 8 and a central channel portion 12c. The channel portion 12c is narrower than the spacing between the source and drain electrodes 6, 8 so that the alignment of the channel region 12c is not critical to the operation of the transistor. As will be appreciated from the following, the precise positioning of the channel portion 12c is dictated by the positioning of the gate conductor 16, giving rise to a self-aligned structure.

An insulated gate structure is defined over the silicon layer 12 and comprises gate insulator layers 14 and the gate conductor layer 16. The gate conductor layer 16 is patterned to define the gate electrode, and may comprise an aluminium layer.

The first gate insulator layer 14a is deposited over the semiconductor layer 12 before patterning to define the semiconductor island of the transistor. By depositing the lower gate insulator layer 14a over the semiconductor layer 12 before any patterning of the semiconductor layer, the electrical properties of the interface between the semiconductor layer and the lower gate insulator layer are improved. These two layers are etched together to define the semiconductor island of each transistor, and the upper gate insulator layer 14b is deposited over this structure. The lower gate insulator 14a may have a thickness of approximately 15 nm, and the upper gate insulator layer 14b may have a thickness of approximately 250 nm.

When the transistor is used in a liquid crystal display substrate, the gate conductor 16 may define a row electrode, with the gates of the transistors for a row of pixels being connected together, and one of the source and drain electrodes 6, 8 may define a column electrode. The second gate insulator layer 14b is preferably therefore a relatively thick layer which serves to reduce the parasitic capacitance between the row and column conductors at the points where these conductors cross over. It is preferred that no patterning of the second gate insulator layer 14b is performed so that it may act as a protective layer. Therefore, the subsequent laser annealing process is preferably carried out through that insulator layer.

The surface insulator layer 14c has a thickness selected depending on the wavelength used for laser annealing, to reduce the effect of thickness variations in the gate insulator layer and/or the surface insulator layer on the reflectance of the resulting structure at that wavelength.

Figure 4C:
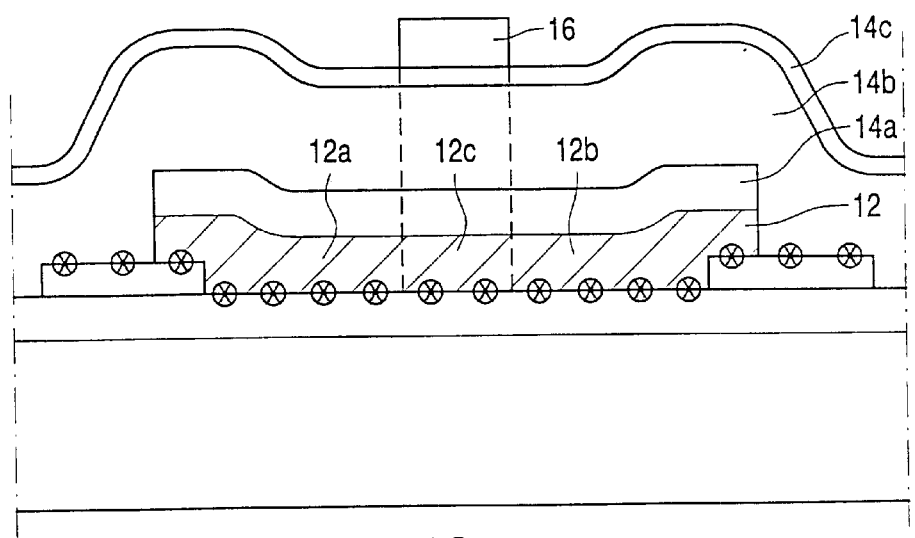

The resulting configuration shown in FIG. 4C is subjected to the laser annealing process, and the gate electrode 16 acts as a mask, so that only the source and drain portions 12a, 12b of the silicon layer 12 are subjected to the laser annealing process, whereas the channel portion 12c remains unaffected. The laser annealing process causes melting of the silicon layer 12, and also causes the impurity phosphorous atoms 10 to diffuse into the surface of the silicon layer 12 causing the desired doping. The resultant structure thereby comprises doped polysilicon source and drain portions 12a, 12b and a substantially undoped amorphous silicon channel portion 12c.

Figure 5:
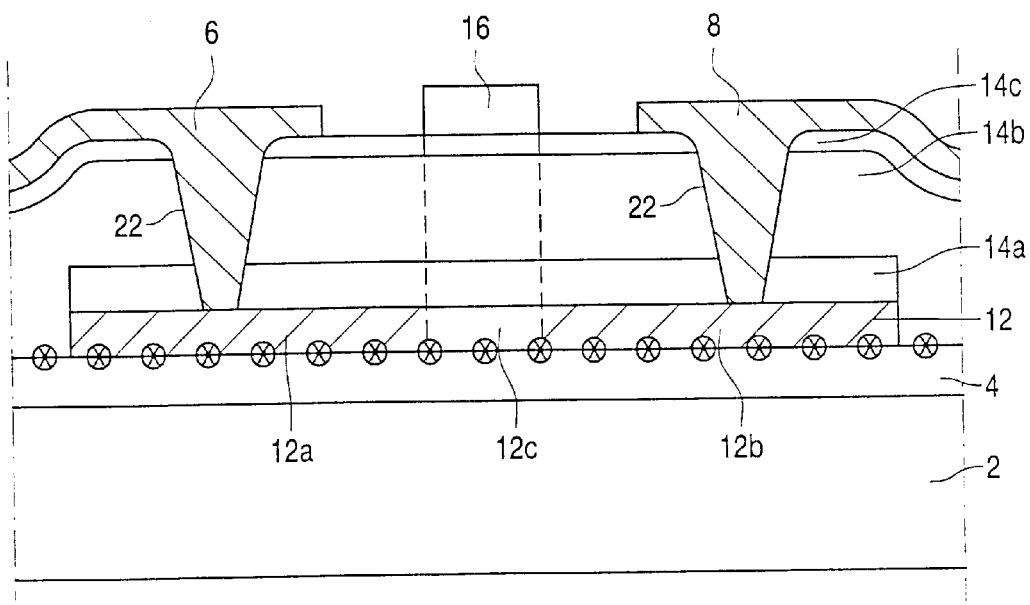
FIG. 5 shows a second embodiment of thin-film transistor of the invention.

FIG. 5 shows a second embodiment of thin-film transistor in which planar source, drain and gate electrodes are used. In this embodiment the silicon layer 12 is provided directly over the insulator layer 4 on the substrate 2. The three layer gate insulator 14a, 14b, 14c is provided over the semiconductor layer 12, and as shown in FIG. 5 the first insulator layer 14a is patterned with the semiconductor layer 12 to define the semiconductor island of the transistor. The gate conductor 16 is deposited and patterned prior to the source and drain electrodes 6, 8. The gate conductor 16 alone is used as a shield for the laser annealing process, which gives rise to the polysilicon regions 12a, 12b and the amorphous silicon shielded channel region 12c. After polycrystallization of the source and drain regions of the silicon layer 12, wells 22 are formed through the insulator layers to enable contact to be made between the polysilicon source and drain regions 12a, 12b and the source and drain electrodes 6, 8.

The function of the different layers in the second embodiment is the same as for the first embodiment, and further detailed description will not be given. Those skilled in the art will appreciate the various processing steps required to form the structure shown in FIG. 5.

The insulating film 4 may be preferred, because it can be used to reduce unevenness in the electrical characteristics of the TFT by smoothing out any irregularities present on the surface of the substrate. However, it may not be required. The plasma treatment has been described as diffusing P (Phosphorus) atoms to produce an n type TFT, but it may equally be possible to produce a p type TFT, for example by $B_2H_6$ plasma treatment to diffuse B (Boron) atoms. In this case the source and drain portions 12a, 12b of the silicon layer 12 will comprise positive doped polysilicon.

The reduced parasitic capacitance and reduced channel to source/drain resistance improves the image qualities of an active-matrix liquid crystal display using thin-film transistors of the invention.

Although separate layers 14a and 14b have been shown, this is not essential, and the gate insulator may comprise a single gate insulator layer and the overlying surface layer.

In the examples described above, the laser treatment process is for laser annealing of the amorphous silicon between the transistor channel and the source and drain, as well as for activating the dopant. The invention may also be applied to polysilicon transistors, in which the channel is also polysilicon, and is crystallised before the laser activation of the dopant atoms. A process for forming such a device is explained with reference to FIG. 6, which shows a polysilicon transistor with planar source, drain and gate electrodes. Where the same components are used as in the structure of FIG. 5, the same reference numerals are used.

Figure 6A:
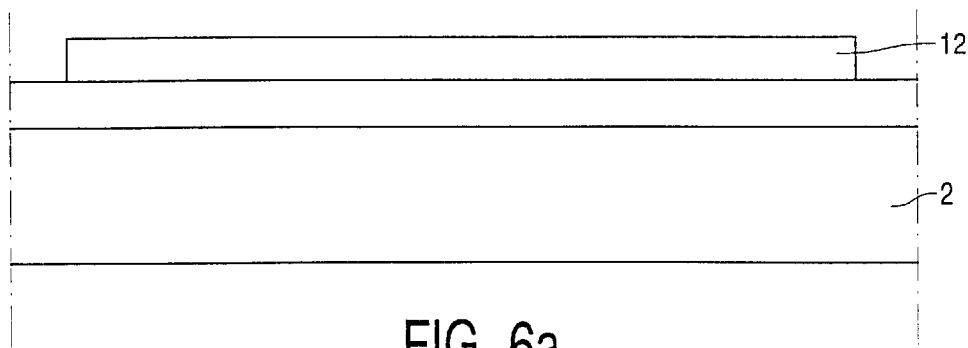
FIG. 6 shows various steps in the manufacture of a thin-film transistor of a third embodiment of the invention.

In FIG. 6A, an amorphous silicon layer 12 is deposited over the insulating substrate 2 and patterned to define the semiconductor island of the transistor. The structure in FIG. 6A is then treated to a laser annealing process to form polycrystalline silicon.

Figure 6B:
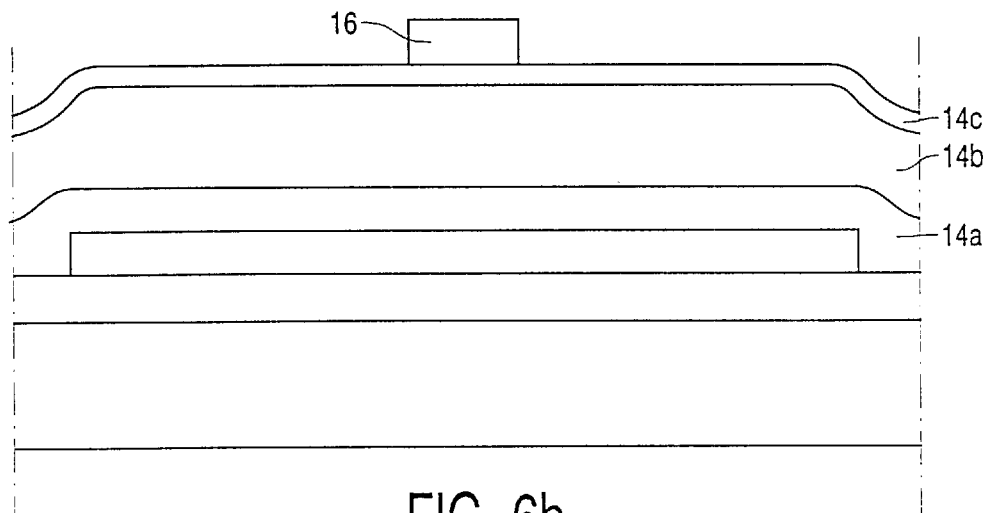
Figure 6C:
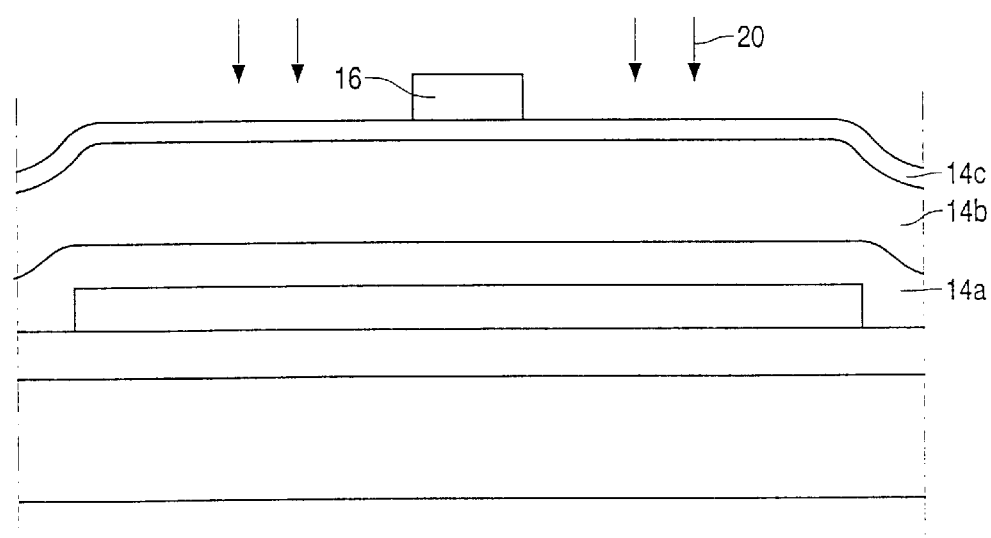

As shown in FIG. 6B, the gate conductor 16 is deposited and patterned over the three gate insulator layers 14a, 14b, 14c. The gate conductor 16 is used as a shield both for the implantation of dopant atoms and for the laser activation of those dopant atoms. Phosphorus may be implanted into the silicon layer, and the implantation and activation is represented by arrows 20 in FIG. 6C. The laser activation results in some melting of the polycrystalline layer, which re-crystallises. The laser treatment process does not need to be controlled to the same degree as in the amorphous silicon examples. However, there is still a desire to minimise the exposure of the remainder of the transistor structure, and to enable the required laser dose to for the dopant activation be predicted accurately.

Figure 6D:
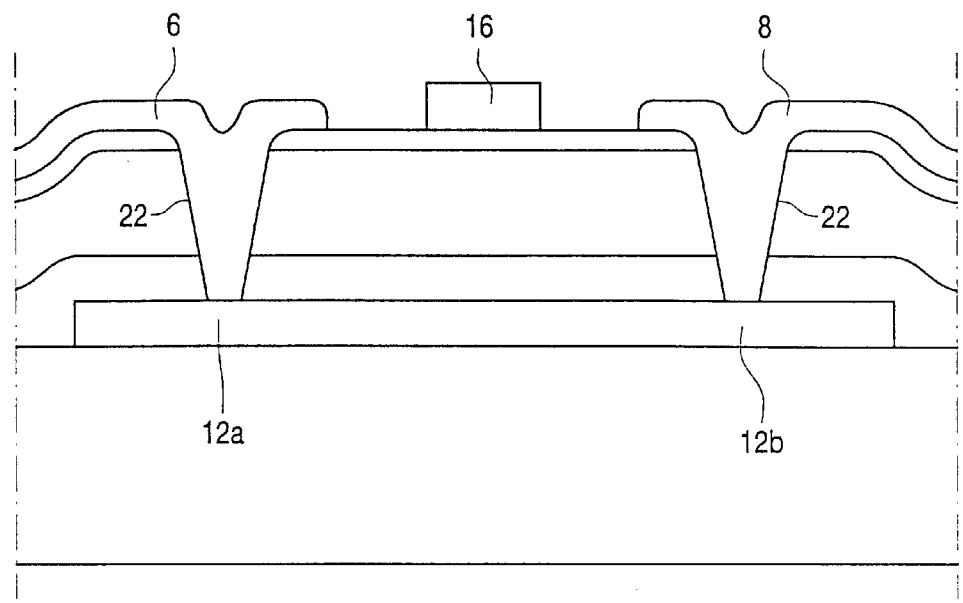

FIG. 6D shows the wells 22 formed through the insulator layers to enable contact to be made between the doped polysilicon source and drain regions 12a, 12b and the source and drain electrodes 6, 8.

In this example, the gate insulator layers comprise silicon oxide 14a, silicon nitride 14b and silicon oxide 14c. Each silicon oxide layer has a thickness of 8 to 15 nm and the silicon nitride layer has a thickness of between 15 and 30 nm. The lower silicon oxide layer provides a good interface with the silicon layer, and the interface between the silicon nitride layer and the top silicon oxide layer provides the require reflectivity.

Figure 7:
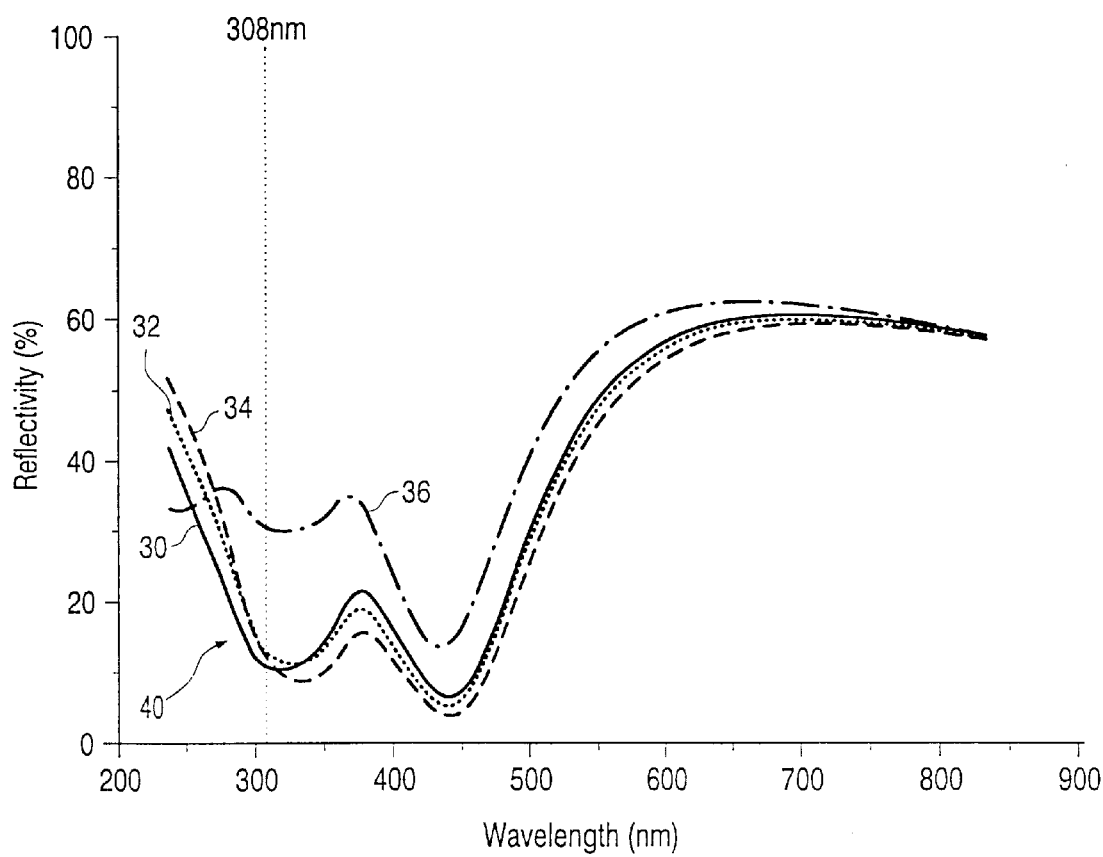
FIG. 7 shows the reflectance of the gate insulator to laser light for the transistor of FIG. 6.

FIG. 7 shows a graph of reflectivity corresponding to that of FIG. 2, but in respect of this three layer gate insulator layer. In this example, a laser wavelength of 308 nm is assumed corresponding to a Xenon Chloride excimer laser. FIG. 7 shows plots for various thickness combinations, in each case over 40 nm of polycrystalline silicon. Plot 30 is for 9 nm silicon oxide, 18 nm silicon nitride and 9 nm silicon oxide. Plot 32 is for 10 nm silicon oxide, 20 nm silicon nitride and 10 nm silicon oxide. Plot 34 is for 12 nm silicon oxide, 16 nm silicon nitride and 12 nm silicon oxide. Plot 36 shows the reflectivity characteristics for a single layer 40 nm silicon oxide gate insulator.

It can be seen that the three layer insulator enables the reflectivity at the laser wavelength to be reduced, and appropriate selection of thicknesses enables the laser wavelength to correspond to a local minima 40. As explained with reference to FIG. 2, this enables the reflectivity to be less sensitive to thickness variations, thereby enabling the laser dose to be controlled more accurately.

A two layer gate insulator may be used in the polycrystalline case, but the three layer design is found to provide a greater degree of control of the reflectance characteristics.

From reading the present disclosure, other modifications will be apparent to persons skilled in the art. Such modifications may involve other features which are already known in the design of thin-film transistors which may be used instead of or in addition to features already described herein.

What is claimed is:

1. A method of producing a top gate thin-film transistor, comprising the steps of:

forming an amorphous silicon layer (12) over an insulating substrate (2);

forming an insulated gate structure (14) over the amorphous silicon layer having gate insulator layers (14a, 14b, 14c) and an upper gate conductor (16) directly over the gate insulator layers, the gate conductor being patterned to be narrower than a spacing to be provided between source and drain electrode contacts (6, 8) to the amorphous silicon layer;

laser annealing areas of the amorphous silicon layer not shielded by the gate conductor, through all of the gate insulator layers, to form polysilicon portions, wherein the gate insulator layers are formed as first and second gate insulator layers (14a, 14b) of first refractive index, and a third insulator layer (14c) of second, lower, refractive index overlying both said first and second gate insulator layers (14a, 14b) and in contact with said second insulator layer (14b).

2. A method as claimed in claim 1, wherein the gate insulator layer is at least five times thicker than the surface insulator layer.

3. A method as claimed in claim 1, wherein a source and drain electrode pattern (6,8) is provided on the substrate before the formation of the amorphous silicon layer (12).

4. A method as claimed in claim 3, wherein the face of the substrate on which the source and drain electrode pattern is formed is subjected to plasma treatment to form a doped surface layer having impurity atoms diffused therein, and wherein the laser annealing forms polycrystalline silicon portions having the impurities diffused therein.

5. A method as claimed in claim 1, wherein a source and drain electrode pattern (6,8) is formed over the gate insulator, the source and drain electrodes contacting the silicon layer though wells (22) defined in the gate insulator (14).

6. A method as claimed in claim 1, wherein the gate insulator comprises first and second gate insulator layers (14a,14b), the first gate insulator layer (14a) being patterned with the amorphous silicon layer (12) to define a semiconductor island of the transistor with an overlying first gate insulator layer.

7. A method as claimed in claim 1, wherein the gate insulator layer (14a,14b) comprises silicon nitride, and the surface insulator (14c) comprises silicon oxide.

8. A method as claimed in claim 1, wherein the laser annealing process comprises exposing the structure to laser light (18) of predetermined wavelength, the thickness of the surface insulator (14c) being selected depending on the wavelength, to reduce the effect of thickness variations in the gate insulator layer and/or the surface insulator on the reflectance of the structure at the predetermined wavelength.

9. A method of producing a top gate thin-film transistor, comprising the steps of:

forming an amorphous silicon layer (12) over an insulating substrate (2);

treating the silicon layer (12) to form a polysilicon layer;

forming an insulated gate structure (14,16) over the amorphous silicon layer comprising gate insulator layers (14a,14b,14c) and an upper gate conductor (16) directly over the gate insulator layers, the gate conductor (16) being patterned to be narrower than a spacing to be provided between source and drain electrode contacts (6,8) to the silicon layer (12);

implanting a dopant (20) into the regions of the polysilicon layer not shielded by the gate conductor;

laser treating the regions of the polysilicon layer (12) not shielded by the gate conductor (16) to activate the dopant atoms, wherein the gate insulator layers are formed as first and second gate insulator layers (14a, 14b) of first refractive index, and a third insulator layer (14c) of second, lower, refractive index overlying both said first and second gate insulator layers (14a, 14b) and in contact with said second insulator layer (14b)—and delete "as a gate insulator layer (14b) of first refractive index, and an overlying insulator layer (14c) of second, lower, refractive index, and wherein the insulated gate structure further comprises at least three gate insulator layers" as a gate insulator layer (14b) of first refractive index, and an overlying insulator layer (14c) of second, lower, refractive index, and wherein the insulated gate structure further comprises at least three gate insulator layers.

10. A method as claimed in claim 9, wherein the gate insulator layers are formed as a lower gate insulator layer, the gate insulator layer of first refractive index overlying the lower gate insulator and the overlying insulator layer of second, lower, refractive index.

11. A method as claimed in claim 10, wherein the lower gate insulator comprises an oxide, the gate insulator layer of first refractive index comprises a nitride and the gate insulator of second, lower, refractive index comprises an oxide.

12. A method as claimed in claim 11, wherein the lower gate insulator comprises silicon oxide, the gate insulator layer of first refractive index comprises silicon nitride and the gate insulator of second, lower, refractive index comprises silicon oxide.

13. A method as claimed in claim 12, wherein each silicon oxide layer has a thickness of 8 to 15 nm and the silicon nitride layer has a thickness of between 15 and 30 nm.

14. A method as claimed in claim 9, wherein a source and drain electrode pattern (6,8) is formed over the gate insulator (14), the source and drain electrodes contacting the silicon layer though wells (22) defined in the gate insulator (14).

15. A method as claimed in claim 9, wherein the laser annealing process comprises exposing the structure to laser light of predetermined wavelength, the thickness of the gate insulator layers (14a,14b,14c) being selected depending on the wavelength, to reduce the effect of thickness variations in the gate insulator layers on the reflectance of the structure at the predetermined wavelength.

* * * * *